(12) United States Patent
Nakazawa et al.

(10) Patent No.: US 6,998,350 B2
(45) Date of Patent: Feb. 14, 2006

(54) METHOD FOR FORMING MICRO GROOVE STRUCTURE

(75) Inventors: Tatsuhiro Nakazawa, Osaka (JP); Keiji Tsunetomo, Osaka (JP)

(73) Assignee: Nippon Sheet Glass Co., LTD, Tokyo (JP)

( * ) Notice: Subject to any disclaimer, the term of this patent is extended or adjusted under 35 U.S.C. 154(b) by 106 days.

(21) Appl. No.: 10/396,426

(22) Filed: Mar. 26, 2003

(65) Prior Publication Data

US 2003/0211739 A1    Nov. 13, 2003

(30) Foreign Application Priority Data

Mar. 26, 2002   (JP)   ............................ P2002-084735

(51) Int. Cl.
    *H01L 21/302*   (2006.01)
    *H01L 21/461*   (2006.01)
(52) U.S. Cl. ..................... 438/717; 438/734; 438/945
(58) Field of Classification Search ................ 438/945, 438/717, 734
    See application file for complete search history.

(56) References Cited

U.S. PATENT DOCUMENTS

| | | | | |
|---|---|---|---|---|
| 6,106,679 A | * | 8/2000 | Westwood | ............ 204/192.32 |
| 2003/0091865 A1 | * | 5/2003 | Chen et al. | .................. 428/693 |
| 2004/0077178 A1 | * | 4/2004 | Yang et al. | .................. 438/710 |

* cited by examiner

*Primary Examiner*—David Blum
*Assistant Examiner*—Heather A. Doty
(74) *Attorney, Agent, or Firm*—Whitham, Curtis & Christofferson P.C.

(57) ABSTRACT

A method of forming a micro groove structure according to the invention has the steps of: (a) forming a mask pattern on a substrate capable of being subjected to dry etching; (b) dry etching the substrate having the mask pattern formed thereon; (c) vapor-phase forming a thin film of a masking material for the dry etching, on a non-etched surface portion of the substrate after the dry etching; and (d) dry etching the substrate having the thin film formed thereon. The steps (a) to (d) are carried out successively.

16 Claims, 3 Drawing Sheets

1μm

METHOD FOR FORMING MICRO GROOVE STRUCTURE

The present application is based on Japanese Patent Application No. 2002-84735, the entire contents of which are incorporated herein by reference.

BACKGROUND OF THE INVENTION

1. Field of the Invention

The present invention relates to a method for forming a microstructure by dry etching and particularly to a method for forming a micro groove structure excellent in shape controllability.

2. Related Art

Optical elements having microstructures shape-controlled on scales of from the order of microns to the order of nanometers have been developed with the advance of the field of information communications in recent years. Functional elements of similar microstructures have been developed also in the biotechnological and medical field as well as the information communication field.

At present, lithography technology is a typical micromachining technique. This is a technique for forming a micro concavoconvex shape in a substrate material by etching after forming a desired pattern by irradiating a photosensitive resist with energy wave such as ultraviolet rays, electron beams or X-rays and masking the substrate material with the resist per se or transferring the pattern onto a high durable material such as metal and masking the substrate material with the high durable material.

On the other hand, sophistication of the micro shape formed in the substrate, increase of the aspect ratio in the concavoconvex shape, diversification of the material to be etched, etc. are required of an etching technique. Dry etching using plasma has begun to be frequently used as a technique which meets such requirements of more accurate etching.

As the mask pattern is sophisticated and made micro as described above, abrasion of the masking material at etching, however, becomes an issue. Particularly when a deep groove needs to be formed in the substrate, there occurs a problem that the groove depth allowed to be etched is decided by abrasion of the masking material.

Although improvement of selective ratio indicating the etching speed ratio between the masking material and the substrate material can be achieved to a certain degree by selection of the masking material, etching gas, plasma condition, etc., the improvement achieved has a limit when it depends on physical and chemical properties of the material.

Although the durability of the mask can be improved when the mask per se is made thick, the mask needs to be patterned by photolithography or the like in advance. The mask allowed to be machined from a photo resist finite in thickness has a limit in thickness. In addition, provision of the mask as a thicker film than required brings a problem that micro pattern accuracy is spoiled.

SUMMARY OF THE INVENTION

The invention is developed to solve these problems and an object of the invention is to provide a method for forming a micro groove structure by dry etching without any limit due to the durability of a mask.

A method of forming a micro groove structure according to the invention has the steps of: (a) forming a mask pattern on a substrate capable of being subjected to dry etching; (b) first dry etching the substrate having the mask pattern formed thereon; (c) vapor-phase forming a thin film of a masking material for next dry etching, on a non-etched surface portion of the substrate after the first dry etching; and (d) subsequent dry etching the substrate having the thin film formed thereon. The steps (a) to (d) are carried out successively.

Incidentally, the above "non-etched surface portion of the substrate" is not limited to a surface of the substrate which was masked in the step (a) so as to form the mask pattern and exposed by the abrasion of the mask in the dry etching of the step (b), but it may include a surface of the mask pattern remained after performing the dry etching of the step (b).

Preferably, after the steps (a) to (d) are carried out successively, the steps (c) and (d) are repeated successively one or more times. This repetition makes it possible to form each groove having a higher aspect ratio. The term "aspect ratio" means the ratio of the depth of the groove to the width of the groove.

Because a mask is formed again after dry etching is carried out to a certain degree, additional etching can be repeated any number of times. Accordingly, a desired micro groove structure can be formed without any limit due to abrasion of the mask.

Preferably, in the step (c) carried out initially and the step (c) repeated afterwards, particles forming the thin film are obliquely deposited on the substrate.

Accordingly, the masking material can be prevented from being deposited on a bottom of each micro groove during machining when the mask is formed again. There is no hindrance to additional etching.

Preferably, inductive coupling plasma reactive ion etching is used as the dry etching in the steps (b) and (d).

Further, when the mask pattern formed in the step (a) is a pattern of straight lines periodic in one direction or in two directions in a plane of the substrate, a periodic micro concavoconvex structure can be formed.

Further, when the method for forming the micro groove structure is applied to a substrate having a multilayer film structure, a two-dimensional or three-dimensional periodic structure can be formed.

DETAILED DESCRIPTION OF THE PREFERRED EMBODIMENTS

An embodiment of the invention will be described below in detail with reference to the drawings. FIGS. 1A to 1D are conceptual views showing the invention.

Figure 1A:
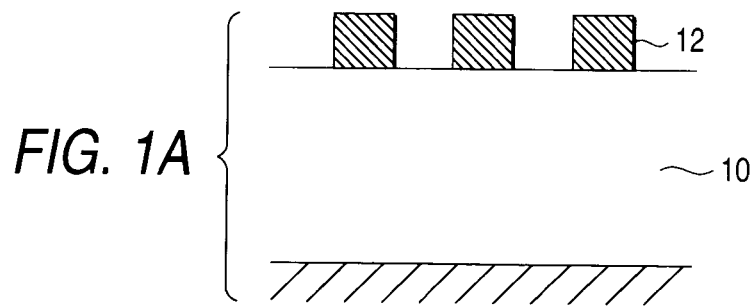
FIGS. 1A to 1D are views for explaining the groove formation steps of the invention.

First, a thin film of a masking material having a predetermined thickness is formed on a surface of a substrate 10 to be etched, and subjected to a method such as photolithography to thereby form a mask pattern of a desired masking material 12 (FIG. 1A).

First, a photo resist is applied on a surface of a substrate. The photo resist is exposed to light while a photo mask of a desired pattern is used. The photo resist is developed so that a mask pattern due to the photo resist is formed.

As occasion demands, a mask of a metal such as chromium, nickel or titanium or a mask of an inorganic material such as silica or titania can be also used. In each of these cases, a pattern is formed in the same manner as described above after a film of the masking material is formed-on the substrate and a photo resist or the like is applied on the film. Then, while the photo resist or the like is used as a mask, the masking material is etched to form opening portions.

Alternatively, a lift-off method may be used. The method is a method of forming a mask pattern by the steps of: forming a film of a masking material on a photo resist formed as a reversal pattern; and removing the photo resist. The method can be effectively applied to a masking material such as precious metal which is hard to be etched.

Although ultraviolet irradiation is generally used for exposing the photo resist to light, electron beam writing or X-ray exposure is suitable for forming a more micro pattern.

The invention can be applied even when any method and any masking material are used.

A first-time etching process is performed for a predetermined time in the condition that this mask is used. The time is decided so that the mask pattern is not deteriorated due to abrasion (12a) of the masking material 12 by etching.

Dry etching is used as the etching. The reason why dry etching is used is based on the shape controllability thereof. In wet etching, liquid goes to the back of the masking material because of the isotropic property thereof. Although the property may be ignored when the shape is etched in the order of microns in the condition that the aspect ratio is not required, the property becomes a significant issue as the etching scale is reduced from the order of microns to the order of sub-microns or nanometers. When a material such as crystal per se having anisotropy is used, directional etching can be made but the substrate material is limited to such a material.

On the other hand, in dry etching, directivity can be given to a process when an external field such as an electric field is operated because gas such as ionized gas having electric charge is mainly used as etching gas. Dry etching is classified into a physical method such as ion beam etching or laser ablation and a method using chemical reaction such as reactive ion etching (RIE).

Particularly, reactive ion etching is a process which is effective for materials to be etched because a gas reactive to a material to be etched can be selected so that etching can be made by using various mixed gases. Especially, inductive coupling plasma reactive ion etching (ICP-RIE) is promising from the point of view of increase in etching rate and increase in etching area because plasma can be generated densely and stably. Moreover, ICP-RIE can prevent the substrate from being damaged because the substrate is not exposed to plasma compared with the general opposed type RIE.

Figure 1B:
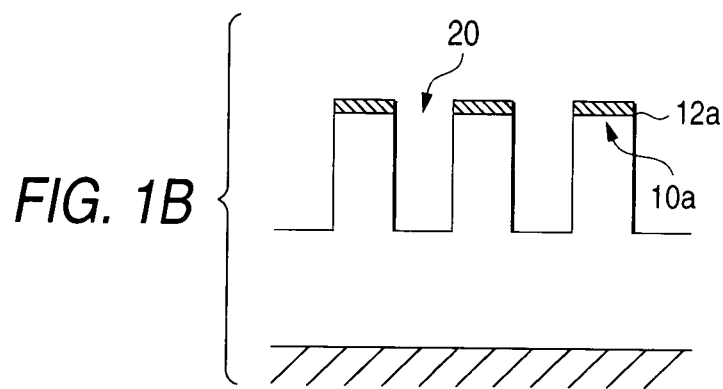

In addition, when fluorocarbon gas is introduced, a carbon polymer film can be deposited on an un-etched portion to thereby control the directivity of etching. That is, when etching is performed while a polymer film is formed on a side wall of each groove at the time of formation of grooves, the grooves can be formed as high-aspect-ratio grooves. According to this method, each groove can be made deep in proportion to the etching time. Because the etching time is however a time in which the masking material is present, it is unchanged that the durability of the masking material is significant as described above in the related art. In any case, it is important to select a method adapted to the substrate material to be etched. By any one of these methods, grooves 20 each having a side surface substantially perpendicular to a surface of the substrate can be formed (FIG. 1B).

Figure 1C:
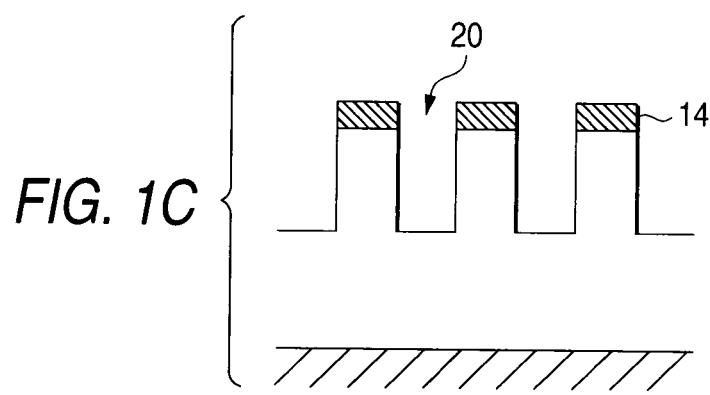

Then, a second-time mask-forming process is applied to a portion 10a of the substrate surface which has been not etched yet. On this occasion, an idea is required so that the masking material is not deposited on the inside of the etched groove 20 portion (FIG. 1C). It is therefore preferable that a film of the masking material is formed in a direction inclined to the substrate.

Here, on the surface of the portion 10a of the substrate surface which has been not etched, it is not necessary that the masking material is completely removed. The second-time mask-forming process can be performed on the masking material formed in the first-time mask-forming process.

A vacuum evaporation apparatus or a sputtering apparatus can be used for forming a metal mask film. Various kinds of sputtering apparatuses such as facing target sputtering, ion beam sputtering, helicon sputtering, etc. may be used as the sputtering apparatus. The film-forming tendency varies according to the configuration of the apparatus.

The directivity of the film-forming component is important to the invention. The film-forming mode is roughly classified into a mode in which the film-forming component reaches the substrate straightly (with directivity) and a mode in which the film-forming component reaches the substrate in all directions (without directivity). The relation between the film-forming directivity and the pattern of the material to be etched needs to be considered so that the masking material can be prevented from being deposited on the portion to be etched.

Figure 2:
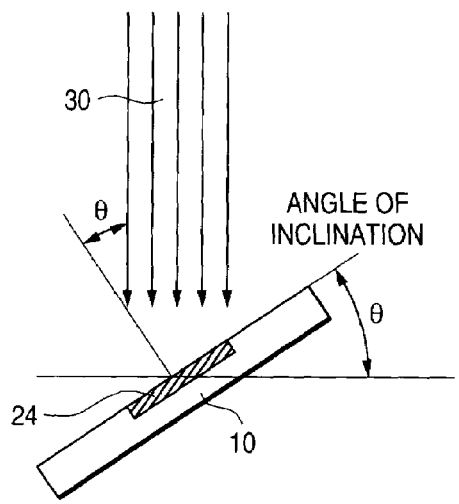
FIG. 2 is a view for explaining oblique film-forming.

If film-forming is performed perpendicularly to the substrate surface in the condition that film-forming is performed with directivity, it is a matter of course that the masking material is deposited on the inside of each groove etched initially. This problem can be solved when the film is formed obliquely on the substrate in which grooves have been already formed to a certain degree by initial etching. Specifically, when film-forming is performed in the condition that the substrate 10 is inclined at an angle θ to the direction of a film-forming particle beam 30 as shown in FIG. 2, the masking material can be prevented from being deposited on the inside of each of grooves in the patterned portion 24.

On the other hand, when film-forming is performed without directivity, a film-forming effect can be obtained to a certain degree by oblique film-forming but the masking material is still unavoidably deposited on the portion to be etched because of the perpendicular component of the masking material. The degree of deposition, however, depends on the groove structure formed by initial etching.

Figure 3:
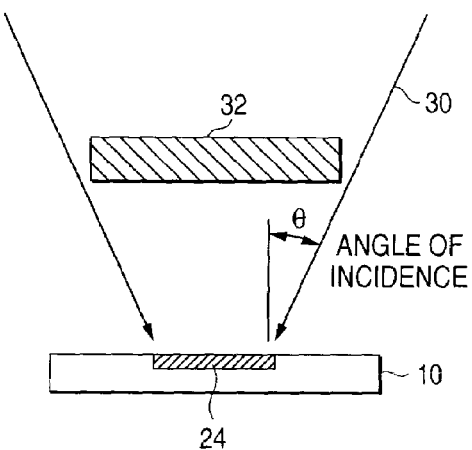
FIG. 3 is a typical view showing an oblique film-forming method according to the invention.

In such a case, a baffle 32 may be placed in front of the patterned portion 24 having an etched groove portion as shown in FIG. 3 so that the film-forming component perpendicular to the substrate 10 surface can be removed to perform only oblique film-forming. The angle of incidence of the oblique film-forming component can be decided on the basis of the distance between the substrate 10 surface and the baffle 32 and the size of the baffle 32.

Figure 4:
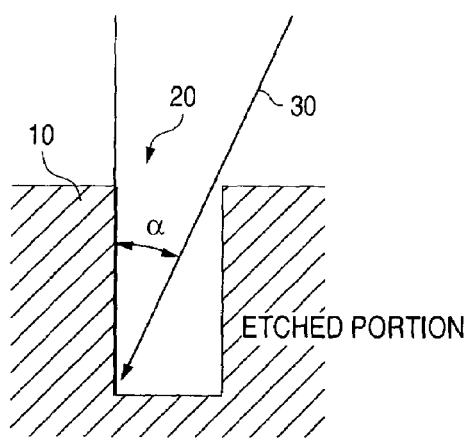
FIG. 4 is an enlarged typical view of a portion in which a groove is formed.

In any case, the maximum angle α (FIG. 4) at which the film-forming component reaches the portion to be etched and the minimum angle θ of incidence of the film-forming component is selected to satisfy the relation α<θ roughly. Conversely, when the inclination angle of the substrate or the size of the baffle and the distance between the substrate and the baffle are adjusted in consideration of the depth of each of the grooves 20 formed by the first-time etching process, the mask-forming range can be controlled to the optimum.

Figure 1D:
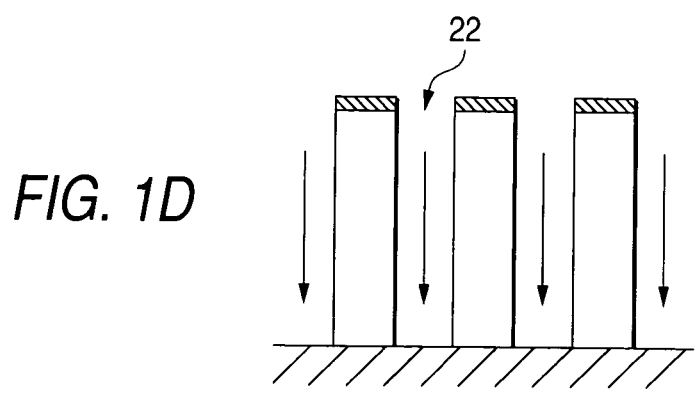

When a second-time etching process is then performed, high-aspect-ratio grooves 22 which could not be achieved because of poor durability of the masking material in the related art can be formed (FIG. 1D). This means that grooves can be formed even in the case where the substrate material is very slow in etching rate, that is, poor in selective ratio with respect to the masking material. For example, deep grooves can be formed even in a structure such as a periodic line pattern in the scale of the order of sub-microns, which is severe in abrasion because of the large specific surface area of the mask.

When regeneration of the mask and etching after the regeneration of the mask are repeated alternately, the problem that desired etching cannot be made because of shortage of durability of the mask can be solved theoretically. If there is a hindrance to patterning accuracy when the mask is made thick at the time of regeneration of the mask, the number of repeated regeneration of the mask and etching may be increased while etching in the fourth step (d) is performed for a short time so that etching can be made with higher accurate.

EXAMPLE

An example of a micro groove structure formed in a dielectric multilayer film by a method according to the invention will be described below.

A multilayer film (of 20 layers each having a thickness of 310 nm) in which silica ($SiO_2$) and titania ($TiO_2$) were laminated alternately on a silica glass substrate by vacuum vapor deposition was used as a substrate material.

First, a resist was patterned. After the multilayer film substrate was spin-coated with an electron beam resist (ZEP520 made by Zeon Corp.) about 0.5 µm thick, the electron beam resist was baked in an oven at 180° C. for 20 minutes. The electron beam resist was spin-coated with an antistatic agent (ESPACER 300Z made by Showa Denko K.K.) about 50 nm thick. An electron beam writing apparatus (ELS5700 made by Elionix Inc.) was used for performing writing, so that a linear pattern with a line width of 0.5 µm was formed.

On the sample subjected to patterning, a film of chromium about 100 nm thick was formed by a sputtering apparatus (facing target sputtering apparatus made by Osaka Vacuum, Ltd.) with chromium as a target. Then, the mask pattern was transferred and formed by a lift-off method. An inductive coupling plasma reactive ion etching apparatus (RIE-200IP made by SAMCO International, Inc.) was used for etching. Etching was performed for 15 minutes while $C_3F_8$ and argon were used as reactive gases in plasma. The depth of the groove formed in this case was about 2.4 µm. The aspect ratio was about 5. On this occasion, the chromium mask deteriorated to a nearly critical point.

After this sample was attached to the sputtering apparatus again, a baffle was provided in the apparatus so as to be far by 5 mm from an upper surface of the substrate. The baffle was a rectangular stainless plate with a size of 5×20 mm and a thickness of 0.5 mm. The baffle was disposed so that 20 mm-long sides were parallel to the lengthwise direction of the line pattern formed on the substrate. A film of chromium was formed for 25 minutes to thereby regenerate the mask. On this occasion, a film of chromium about 200 nm thick was formed on each convex top portion of the pattern. Etching was performed again for 20 minutes by the etching apparatus.

Figure 5A:
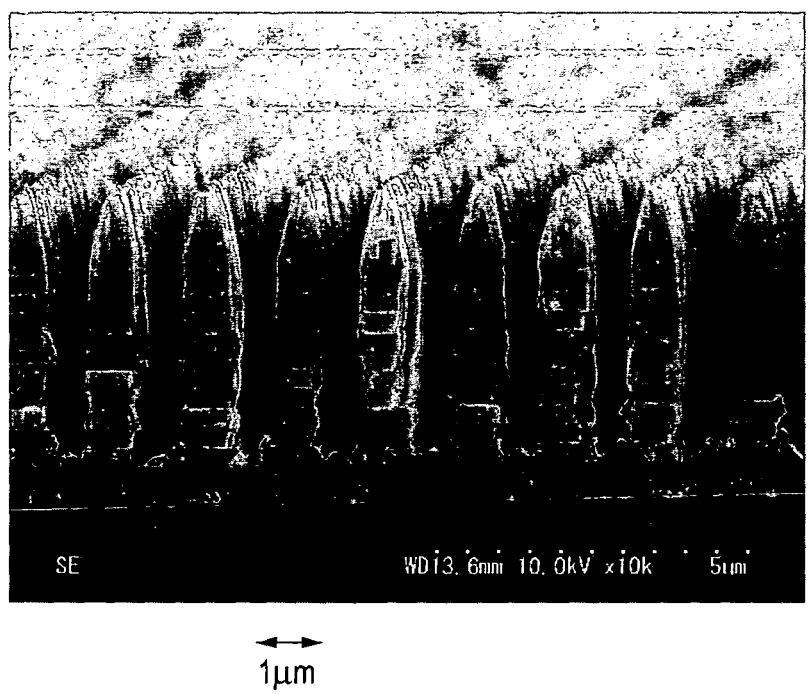
FIGS. 5A and 5B are views showing external appearance of photonic crystal formed as an embodiment of the invention.
Figure 5B:
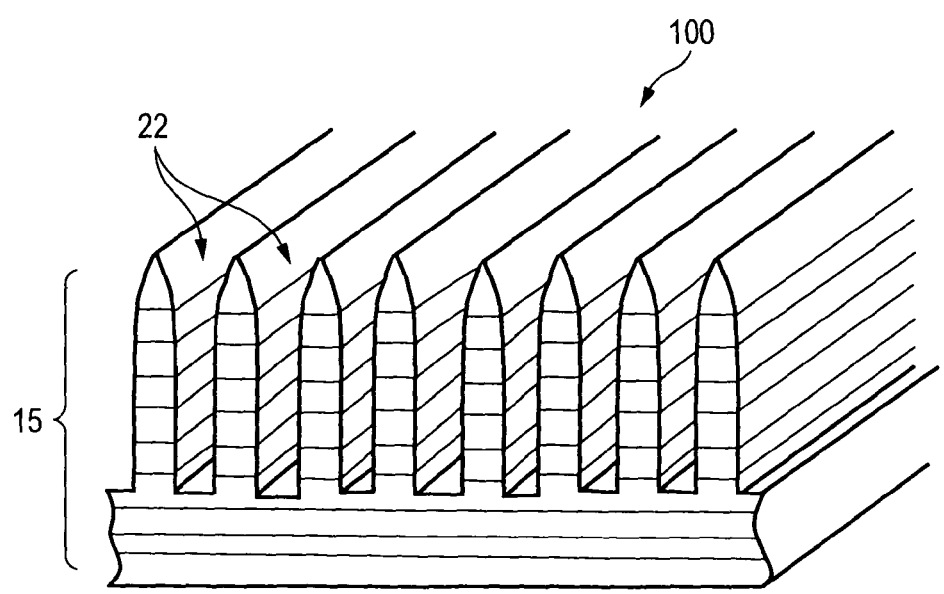

FIG. 5A shows a photograph as a result of etching. FIG. 5B is a typical view of the etching result. When periodic grooves 22 were formed in the multilayer film 15, a two-dimensional periodic structure 100 could be formed. This structure functioned as so-called photonic crystal. On this occasion, the depth of each groove reached to 4.5 µm and the aspect ratio was about 9 when the width of the groove was 0.5 µm.

According to the invention, a high-aspect-ratio groove structure which could not be formed by dry etching because of shortage of durability of a masking material in the related art can be achieved when both regeneration of a mask and etching are repeated in a process.

What is claimed is:

1. A method of forming a micro groove structure, comprising the steps of:
   (a) forming a mask pattern on a substrate capable of being subjected to dry etching;
   (b) first dry etching said substrate having said mask pattern formed thereon;
   (c) vapor-phase forming a thin film of a masking material for subsequent dry etching, on a non-etched surface portion of said substrate after said first dry etching; and
   (d) next dry etching said substrate having said thin film formed thereon, wherein after the steps (a) to (d) are carried out successively, the steps (c) and (d) are repeated successively one or more times.

2. A method of forming a micro groove structure according to claim 1, wherein the step (c) is carried out in such way that particles of masking material forming said thin film are obliquely deposited on said substrate.

3. A method of forming a micro groove structure according to claim 1, wherein said substrate has a multilayer film structure.

4. A method of forming a micro groove structure according to claim 1, wherein the step (c) is carried out in such way that particles of masking material forming said thin film are obliquely deposited to the substrate due to a baffle being disposed in front of said substrate when particles of masking material forming said thin film are deposited on said substrate.

5. A method of forming a micro groove structure according to claim 1, wherein an angle of incidence of particles of masking material to a surface of said substrate is substantially larger than an angle at which the particles reach a portion of the substrate to be etched in the step (d).

6. A method of forming a micro groove structure, comprising the steps of:
   (a) forming a mask pattern on a substrate capable of being subjected to dry etching;
   (b) first dry etching said substrate having said mask pattern formed thereon;
   c) vapor-phase forming a thin film of a masking material for subsequent dry etching, on a non-etched surface portion of said substrate after said first dry etching; and
   (d) next dry etching said substrate having said thin film formed thereon, wherein said mask pattern formed in the step (a) is a pattern of straight lines periodic in one direction or in two directions in a plane of said substrate.

7. A method of forming a micro groove structure, comprising the steps of:
   (a) forming a mask pattern on a substrate capable of being subjected to dry etching;

(b) first dry etching said substrate having said mask pattern formed thereon;

c) vapor-phase forming a thin film of a masking material for subsequent dry etching, on a non-etched surface portion of said substrate after said first dry etching; and (d) next dry etching said substrate having said thin film formed thereon, wherein inductive coupling plasma reactive ion etching is used in the steps (b) and (d).

8. A method of forming a micro groove structure, comprising the steps of:
   (a) forming a mask pattern on a substrate capable of being subjected to dry etching;
   (b) first dry etching said substrate having said mask pattern formed thereon;
   (c) vapor-phase forming a thin film by sputtering particles of a masking material for subsequent dry etching, on a non-etched surface portion of said substrate after said first dry etching; and
   (d) next dry etching said substrate having said thin film formed thereon, and wherein
   the step (c) carried out such way that the particles of masking material forming said thin film are obliquely deposited on said substrate due to substrate inclination.

9. A method of forming a micro groove structure according to claim 8, wherein after the steps (a) to (d) are carried out successively, the steps (c) and (d) are repeated successively one or more times.

10. A method of forming a micro groove structure according to claim 8, wherein said mask pattern formed in the step (a) is a pattern of straight lines periodic in one direction or in two directions in a plane of said substrate.

11. A method of forming a micro groove structure according to claim 8, wherein said substrate has a multilayer film structure.

12. A method of forming a micro groove structure according to claim 8, wherein an angle of incidence of the particles of masking material to a surface of said substrate is substantially larger than an angle at which the particles of said masking material reach a portion of the substrate to be etched in the step (d).

13. A method of forming a micro groove structure, comprising the steps of:
   (a) forming a mask pattern on a substrate capable of being subjected to dry etching;
   (b) first dry etching said substrate having said mask pattern formed thereon;
   (c) vapor-phase forming a thin film by sputtering particles of a masking material for subsequent dry etching, on a non-etched surface portion of said substrate after said first dry etching; and
   (d) next dry etching said substrate having said thin film formed thereon, and wherein
   the step (c) carried out such way that the particles of masking material forming said thin film are deposited obliquely to the substrate due to a baffle being disposed in front of said substrate when particles of masking material forming said thin film are deposited on said substrate.

14. A method of forming a micro groove structure according to claim 13, wherein after the steps (a) to (d) are carried out successively, the steps (c) and (d) are repeated successively one or more times.

15. A method of forming a micro groove structure according to claim 13, wherein said mask pattern formed in the step (a) is a pattern of straight lines periodic in one direction or in two directions in a plane of said substrate.

16. A method of forming a micro groove structure according to claim 13, wherein said substrate has a multilayer film structure.

* * * * *